United States Patent
Chan et al.

(10) Patent No.: US 8,233,331 B2
(45) Date of Patent: Jul. 31, 2012

(54) SINGLE CLOCK DYNAMIC COMPARE CIRCUIT

(75) Inventors: Yuen H. Chan, Poughkeepsie, NY (US); Antonio R. Pelella, Highland Falls, NY (US); Richard E. Serton, Clinton, NY (US); Arthur Tuminaro, Lagrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 238 days.

(21) Appl. No.: 12/792,475

(22) Filed: Jun. 2, 2010

(65) Prior Publication Data

US 2011/0298500 A1 Dec. 8, 2011

(51) Int. Cl.
*G11C 7/06* (2006.01)
(52) U.S. Cl. .............. 365/189.07; 365/189.05
(58) Field of Classification Search ............. 365/189.07, 365/189.05, 233.1
See application file for complete search history.

(56) References Cited

U.S. PATENT DOCUMENTS

| | | | |
|---|---|---|---|
| 5,515,024 A | 5/1996 | Ghia et al. | |
| 5,528,541 A * | 6/1996 | Ghia et al. | 365/203 |
| 5,765,194 A | 6/1998 | McBride | |
| 5,970,001 A * | 10/1999 | Noda et al. | 365/200 |
| 6,804,133 B1 * | 10/2004 | Khanna | 365/49.15 |
| 7,035,127 B1 | 4/2006 | Adams et al. | |
| 7,116,569 B2 | 10/2006 | Hinojosa et al. | |
| 8,125,810 B2 * | 2/2012 | Bosshart | 365/49.1 |
| 2006/0087873 A1 | 4/2006 | Adams et al. | |
| 2009/0063774 A1 | 3/2009 | Chan et al. | |
| 2010/0182816 A1 * | 7/2010 | Burda et al. | 365/49.17 |

* cited by examiner

*Primary Examiner* — Tuan T. Nguyen
(74) *Attorney, Agent, or Firm* — Cantor Coburn LLP; William A. Kinnaman, Jr.

(57) ABSTRACT

A compare circuit for comparing a first data word with a second data word includes a plurality of sub-circuits, each having a two-bit static compare stage and a dynamic complex logic stage; a dynamic compare node responsive to respective outputs of the sub-circuits; and an output latch that captures a comparison result in accordance with a logic state of the dynamic compare node. In an exemplary embodiment, a local clock generator provides a single controlling clock signal for clocking the output latch, precharging of the dynamic compare node, and clocking of the dynamic complex logic stage of the sub-circuits.

16 Claims, 1 Drawing Sheet

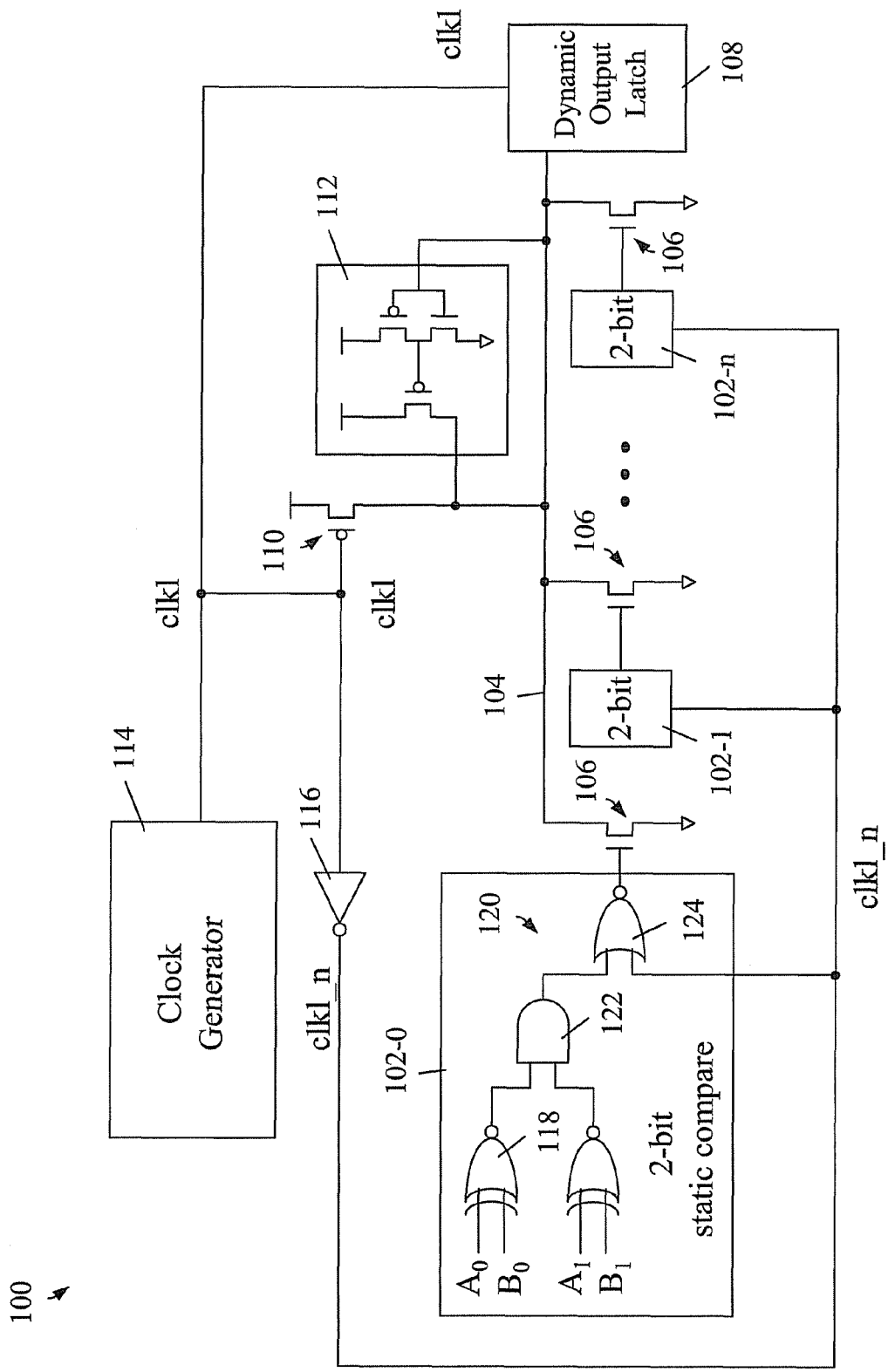

SINGLE CLOCK DYNAMIC COMPARE CIRCUIT

BACKGROUND

The present invention relates generally to integrated circuit memory devices and, more particularly, to a single-clock dynamic compare circuit.

Set associative cache in high performance computer systems is bound by two critical paths, in terms of the time required to access the cache: (1) the cache array access and (2) the hit logic path, which refers to the path that determines whether or not the memory address resides in the cache. For a read operation, in order to speed up the cache access, the hit logic operation and the cache array read operation are typically overlapped in times. That is, both operations are performed in parallel during the same clock cycle.

As will also be appreciated by those skilled in the art, in a set associative cache, a tag memory stores at each addressable tag memory location the addresses of two or more (depending on the size of cache) blocks from main memory stored in the cache. A memory request address includes the cache tag memory address where the address of the requested data will reside in cache if it is in the cache. The addresses in the tag memory at that location are read out of the tag memory and compared with the memory request address. Both static comparators and dynamic comparators have been proposed in the art for comparing the tag address with the requested address in set associative cache memories. However, the implementation of a fully static compare path is generally slow in performance. On the other hand, the implementation of a fully dynamic compare path is complex both in circuit design and timing.

SUMMARY

In an exemplary embodiment, a compare circuit for comparing a first data word with a second data word includes a plurality of sub-circuits, each having a two-bit static compare stage and a dynamic complex logic stage; a dynamic compare node responsive to respective outputs of the sub-circuits; and an output latch that captures a comparison result in accordance with a logic state of the dynamic compare node.

In another embodiment, a method of comparing a first data word with a second data word includes inputting the first and second data words to a dynamic compare circuit, the dynamic compare circuit comprising a plurality of sub-circuits, each having a two-bit static compare stage and a dynamic complex logic stage; a dynamic compare node responsive to respective outputs of the sub-circuits; and an output latch that captures a comparison result in accordance with a logic state of the dynamic compare node.

BRIEF DESCRIPTION OF THE SEVERAL VIEWS OF THE DRAWINGS

Referring to the exemplary drawings wherein like elements are numbered alike:

FIG. 1 is a schematic diagram of a single-clock dynamic compare circuit in accordance with an embodiment of the invention.

DETAILED DESCRIPTION

Disclosed herein is a single-clock controlled, pseudo dynamic compare circuit for memory devices and methodology that substantially provides the benefits of a fully dynamic compare circuit, but with reduced complexity. To reduce such circuit complexity, a portion of the compare circuitry is static, but having improved hit logic compare performance with respect to a fully static compare circuitry with many stages that would otherwise slow performance. Such an approach is particularly advantageous where relative large numbers of bits are simultaneously compared (e.g., >>2, such as in the range of about 10-36 bits or more). As indicated above, the hit logic path timing usually is very critical to the overall system cycle performance. Whereas fully static compare paths are generally slow in performance, fully dynamic paths provide faster speed but at the expense of more complexity in both timing and circuitry.

In brief, the embodiments herein provide multiple sub-circuits, each having a 2-bit static compare circuit (in a front end or first stage of the sub-circuit), followed by a clocked static-to-dynamic evaluation circuit (in a back end or second stage of the sub-circuit) receiving the combined outputs of each 2-bit static compare stage. The resulting outputs of the back end dynamic evaluation stage of each sub-circuit are then fed in parallel (forming a dotted-NOR function) to the input of a dynamic output latch. If any one of the 2-bit compares fails (i.e., the bits do not match), the dynamic compare node will be pulled down to set the output latch. In so doing, the overall complexity of timing the compare path is reduced, while at the same time providing the fast performance of a fully dynamic design. Moreover, the static portion of design reduces the number of total circuit stages from input to output, while using only a single clock signal for the static-to-dynamic conversion, dotted NOR restore, and dynamic latch control.

Referring now to FIG. 1, there is shown a schematic diagram of a single-clock dynamic compare circuit 100 in accordance with an embodiment of the invention. The circuit 100 includes a plurality of sub-circuits 102-0 through 102-$n$, each of which in turn is coupled to a dynamic compare node 104 through a corresponding pull down NFET device 106. ("NFET" here signifies an n-channel field-effect transistor, or FET.) The dynamic compare node 104 is an input to a dynamic compare output latch 108 that ultimately determines whether a complete match or a mismatch occurs between all of the individual bits being compared. By way of a simple example, if a first 36-bit address or data word (bits $A_0 \ldots A_{35}$) is compared with a second 36-bit address or data word (bits $B_0 \ldots B_{35}$), the circuit 100 would include a total of 18 sub-circuits 102 (i.e., 102-0 through 102-17), each comparing 2 of the 36 total bits in the compared addresses.

The circuit 100 further includes a dynamic restore PFET device 110 that precharges the dynamic compare node 104 to Vdd (i.e., logic 1) prior to evaluation, as well as a feedback device 112 including an inverter and keeper PFET or half-latch for holding the charge on the dynamic compare node 104 during evaluation. ("PFET" here signifies a p-channel FET.) A local, single clock generator 114 outputs an active high clock signal, clk1, to control operation of both the dynamic output latch 108 and the dynamic restore PFET 110. In addition, the clock generator 114 also controls the dynamic stage of each sub-circuit 102-0 through 102-$n$ through an inverter 116 that produces an active low clock signal, clk1_$n$.

In further detail, and with specific reference to sub-circuit 102-0, each sub-circuit further includes a pair of 1-bit static comparators in the form of exclusive NOR (XNOR) gates 118. The two outputs of the static comparators are coupled to a complex logic stage 120. In an exemplary embodiment, the complex logic stage 120 is an AND-OR-Invert (AOI) stage, having an AND gate 122 coupled to the outputs of the two XNOR gates 118, and a NOR gate 124 coupled to the output of the AND gate 122. The NOR gate 124 is clocked by the active low signal clk1_n. The output of the NOR gate 124 drives an associated pull down NFET 106.

In a precharge or standby state, the output signal (clk1) of the local clock generator 114 is low, which causes the dynamic restore PFET 110 to maintain that dynamic compare node 104 at Vdd or logic 1 potential. Concurrently, the inverted clock signal clk1_n is high, and thus the outputs of each NOR gate 124 of the sub-circuits 102-0 through 102-$n$ are held low or logic 0 potential. As a result, all NFETs 106 are switched off.

Then, during an evaluation stage, the output signal (clk1) of the local clock generator 114 transitions from low to high, which deactivates the dynamic restore PFET 110. The dynamic feedback device 112 will, subject to the result of the compare operation, maintain the charge on the dynamic compare node 104 against any leakage current in the circuit. Because the inverted clock signal clk1_n now switches from high to low, the AOI stage 120 of each sub-circuit 102-0 through 102-$n$ is activated. That is, the NOR gate 124 will now pass the inverted output of the AND gate 122 to the associated pull down NFET 106.

The results of the two, one-bit compare operations are passed to the AND gate 122. If there is a bit match at a given XNOR gate 118, the output is 1; otherwise the output is zero. Since the result of each compare is ANDed by AND gate 122, the output of the AND gate is 1 only if both of the one-bit compare operations are a match. In this case, the sub-circuit would output a 0, meaning the particular sub-circuit would not contribute to pulling down the dynamic compare node 104. Further, if all of the 2-bit comparisons in sub-circuits 102-1 through 102-$n$ resulted in a complete match, then none of the NFETs 106 would activate, dynamic compare node 104 would stay at the charged logic 1 level, and this value would be captured in dynamic output latch 108.

On the other hand, if any of the bit comparisons in any of the sub-circuits 102-1 through 102-$n$ result in a mismatch, then at least one of the NFETs 106 will conduct and cause the dynamic compare node 104 to be pulled low, thereby latching a mismatch result in the dynamic output latch 108. For example, if bit $A_0$ in sub-circuit 102-0 does not match bit $B_0$, then (regardless of all other comparisons) the output of AND gate 122 is low, meaning that NOR gate 124 outputs a high signal to its associated NFET 106 and discharging dynamic compare node 104.

One fundamental difference between the above described embodiments and previous compare schemes is the use of two separate clock pulses—one clock pulse for performing a dynamic restore and a second clock would trigger the evaluate. With this scheme, the two clock signals are programmed independently so as to not collide. In contrast, the present approach uses just a single clock and implements the precharge operation when the clock signal is in the non-controlling state (0) and evaluates during the controlling state (1). This one-clock solution is much easier to design from a timing perspective.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A compare circuit for comparing a first data word with a second data word, comprising:
    a plurality of sub-circuits, each having a two-bit static compare stage and a dynamic complex logic stage;
    a dynamic compare node responsive to respective outputs of the sub-circuits; and
    an output latch that captures a comparison result in accordance with a logic state of the dynamic compare node.

2. The compare circuit of claim 1, further comprising a local clock generator that provides a single controlling clock signal for clocking the output latch, precharging of the dynamic compare node, and clocking of the dynamic complex logic stages of the sub-circuits.

3. The compare circuit of claim 2, further comprising a pull down NFET coupled to the output of each of the sub-circuits, such that a mismatch from any comparison of the two-bit static compare stage causes the associated NFET to discharge the dynamic compare node.

4. The compare circuit of claim 3, wherein the two-bit static compare stage comprises a first exclusive NOR (XNOR) gate and a second XNOR gate, each XNOR gate comparing a single bit of the first data word with a single bit of the second data word.

5. The compare circuit of claim 4, wherein the dynamic complex logic stage comprises an AND-OR-Invert (AOI) stage with an AND gate coupled to outputs of the first and second XNOR gates and a NOR gate having a first input coupled to an output of the AND gate.

6. The compare circuit of claim 5, wherein an output of the NOR gate is coupled to the pull-down NFET associated with the sub-circuit thereof.

7. The compare circuit of claim 6, wherein a second input of the NOR gate is controlled by the single controlling clock signal.

8. The compare circuit of claim 7, wherein the NOR gate receives an active low, inverted version of the signal controlling clock signal.

9. A method of comparing a first data word with a second data word, the method comprising:
    inputting the first and second data words to a dynamic compare circuit, the dynamic compare circuit comprising a plurality of sub-circuits, each having a two-bit static compare stage and a dynamic complex logic stage;
    a dynamic compare node responsive to respective outputs of the sub-circuits; and
    an output latch that captures a comparison result in accordance with a logic state of the dynamic compare node.

10. The method of claim 9, wherein the dynamic compare circuit further comprises a local clock generator that provides a single controlling clock signal for clocking the output latch, precharging of the dynamic compare node, and clocking of the dynamic complex logic stages of the sub-circuits.

11. The method of claim 10, wherein the dynamic compare circuit further comprises a pull down NFET coupled to the output of each of the sub-circuits, such that a mismatch from any comparison of the two-bit static compare stage causes the associated NFET to discharge the dynamic compare node.

12. The method of claim 11, wherein the two-bit static compare stage comprises a first exclusive NOR (XNOR) gate and a second XNOR gate, each XNOR gate comparing a single bit of the first data word with a single bit of the second data word.

13. The method of claim 12, wherein the dynamic complex logic stage comprises an AND-OR-Invert (AOI) stage with an AND gate coupled to outputs of the first and second XNOR gates and a NOR gate having a first input coupled to an output of the AND gate.

14. The method of claim 13, wherein an output of the NOR gate is coupled to the pull-down NFET associated with the sub-circuit thereof.

15. The method of claim 14, wherein a second input of the NOR gate is controlled by the single controlling clock signal.

16. The method of claim 15, wherein the NOR gate receives an active low, inverted version of the signal controlling clock signal.

* * * * *